US012631672B2

(12) United States Patent
Zhou et al.

(10) Patent No.: US 12,631,672 B2
(45) Date of Patent: May 19, 2026

(54) METHOD FOR IDENTIFYING CONSUMER PHASE CONNECTIVITY IN LOW-VOLTAGE DISTRIBUTION NETWORK BASED ON VOLTAGE ASSOCIATION CHARACTERISTICS

(71) Applicants: SOUTH CHINA UNIVERSITY OF TECHNOLOGY, Guangzhou (CN); GUANGZHOU POWER ELECTRICAL TECHNOLOGY CO., LTD., Guangdong (CN)

(72) Inventors: Lai Zhou, Guangzhou (CN); Yongjun Zhang, Guangzhou (CN); Qinhao Li, Guangzhou (CN);

(Continued)

(73) Assignees: SOUTH CHINA UNIVERSITY OF TECHNOLOGY, Guangzhou (CN); GUANGZHOU POWER ELECTRICAL TECHNOLOGY CO., LTD., Guangdong (CN)

( * ) Notice: Subject to any disclaimer, the term of this patent is extended or adjusted under 35 U.S.C. 154(b) by 467 days.

(21) Appl. No.: 18/010,811

(22) PCT Filed: Dec. 31, 2020

(86) PCT No.: PCT/CN2020/142540
§ 371 (c)(1),
(2) Date: Dec. 16, 2022

(87) PCT Pub. No.: WO2021/253806
PCT Pub. Date: Dec. 23, 2021

(65) Prior Publication Data
US 2023/0236229 A1      Jul. 27, 2023

(30) Foreign Application Priority Data
Jun. 16, 2020    (CN) ......................... 202010550359.1

(51) Int. Cl.
*G01R 19/25* (2006.01)
*G01R 19/00* (2006.01)
*G01R 29/18* (2006.01)

(52) U.S. Cl.
CPC ..... *G01R 19/2513* (2013.01); *G01R 19/0084* (2013.01); *G01R 29/18* (2013.01)

(58) Field of Classification Search
None
See application file for complete search history.

(56) References Cited

U.S. PATENT DOCUMENTS 6,684,111 B2 * 1/2004 Klein ................. G05B 19/0428
714/22
8,788,415 B2 * 7/2014 Chassin ............... G06Q 20/102
705/40

(Continued)

FOREIGN PATENT DOCUMENTS

| CN | 110321919 | 10/2019 |
| CN | 110492480 | 11/2019 |
| CN | 111817291 | 10/2020 |

OTHER PUBLICATIONS

Tang, Jie ; et al., "Data-driven Based Identification Method of Feeder-Consumer Connectivity in Low-voltage Distribution Network," Automation of Electric Power Systems, vol. 44, No. 11, Jun. 2020, pp. 1-12.

(Continued)

*Primary Examiner* — Huy Q Phan
*Assistant Examiner* — Carl F.R. Tchatchouang
(74) *Attorney, Agent, or Firm* — JCIPRNET

(57) ABSTRACT

A method for identifying consumer phase connectivity in low-voltage distribution network based on voltage association characteristics is provided. The specific steps thereof are: first, acquiring users to be identified and voltage time series data of three-phase buses on the low-voltage side of (Continued)

the low-voltage distribution network where the users to be identified are located; then, calculating voltage time series curve correlation coefficients among the users, and classifying a user having the maximum voltage time series curve correlation value with respect to the user into one category to form a user category set; then, based on the user classification, determining an initial consumer phase connectivity according to voltage association characteristics between the users and the three-phase buses on the low-voltage side of the low-voltage distribution network; finally, verifying the initial consumer phase connectivity according to the voltage association characteristics among the users to obtain a final consumer phase connectivity identification result.

7 Claims, 2 Drawing Sheets

(72) Inventors: Yingqi Yi, Guangzhou (CN); Siliang Liu, Guangzhou (CN); Xiangmin Huang, Guangzhou (CN); Chunyan Huang, Guangzhou (CN); Wei Cao, Guangzhou (CN); Haoxia Jiang, Guangzhou (CN)

(56) References Cited

U.S. PATENT DOCUMENTS

| | | | | |
|---|---|---|---|---|
| 11,271,397 B2 * | 3/2022 | Itaya | ....................... | H02J 3/004 |
| 2009/0125351 A1 * | 5/2009 | Davis, Jr. | ............. | G06Q 20/027 |
| | | | | 380/255 |
| 2012/0316691 A1 * | 12/2012 | Boardman | ................ | H02J 3/26 |
| | | | | 700/292 |
| 2013/0138258 A1 * | 5/2013 | Mauk | .................. | H04L 12/2818 |
| | | | | 713/300 |
| 2015/0052088 A1 * | 2/2015 | Arya | ......................... | H02J 3/00 |
| | | | | 706/12 |

OTHER PUBLICATIONS

Lai Zhou; et al., "Consumer phase identification in low-voltage distribution network considering vacant users," Electrical Power and Energy Systems, vol. 121, Oct. 2020, 106079, pp. 1-11.
"International Search Report (Form PCT/ISA/210) of PCT/CN2020/142540," mailed on Mar. 19, 2021, with English translation thereof, pp. 1-6.

* cited by examiner

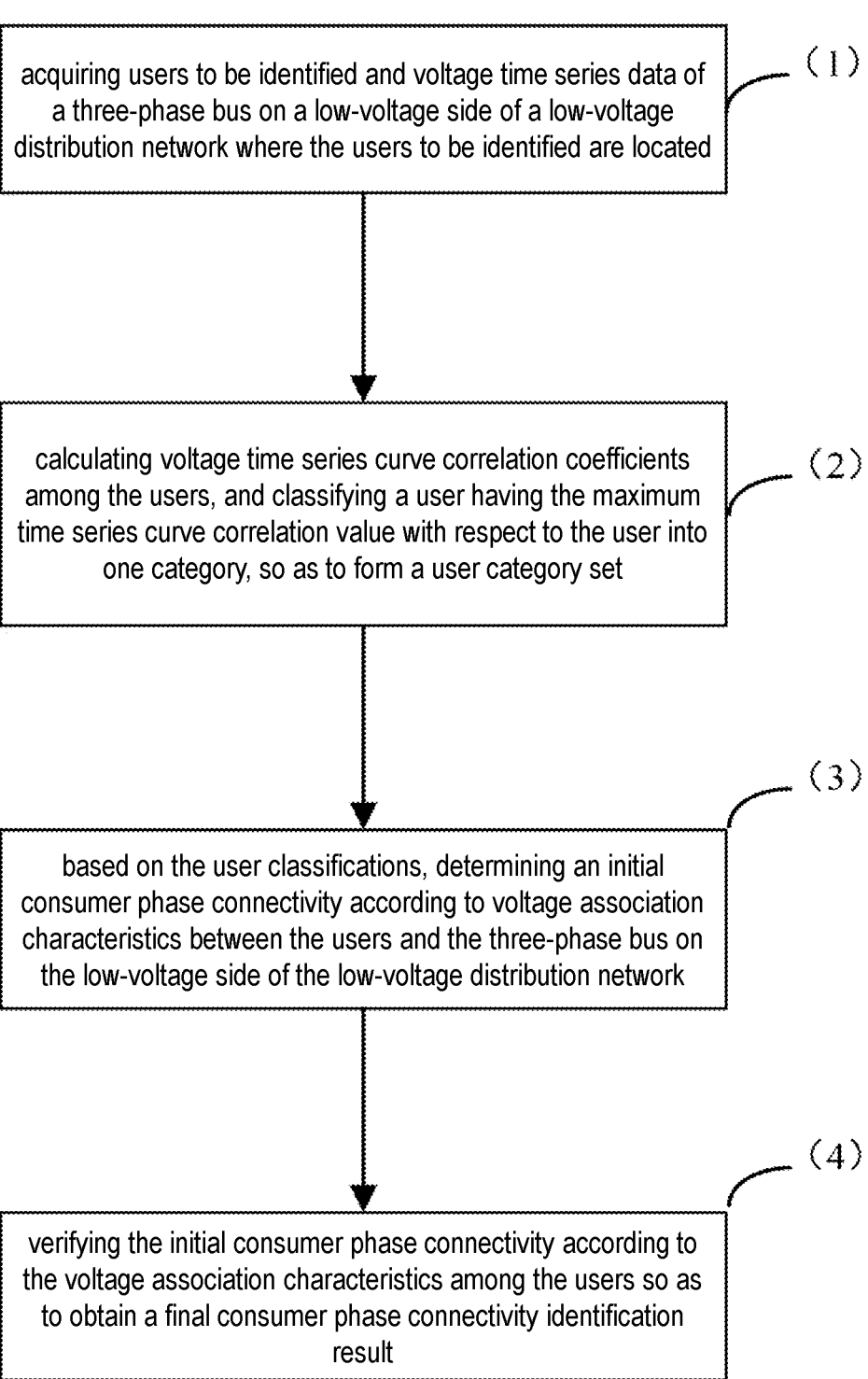

acquiring users to be identified and voltage time series data of a three-phase bus on a low-voltage side of a low-voltage distribution network where the users to be identified are located    (1)

calculating voltage time series curve correlation coefficients among the users, and classifying a user having the maximum time series curve correlation value with respect to the user into one category, so as to form a user category set    (2)

based on the user classifications, determining an initial consumer phase connectivity according to voltage association characteristics between the users and the three-phase bus on the low-voltage side of the low-voltage distribution network    (3)

verifying the initial consumer phase connectivity according to the voltage association characteristics among the users so as to obtain a final consumer phase connectivity identification result    (4)

FIG. 1

METHOD FOR IDENTIFYING CONSUMER PHASE CONNECTIVITY IN LOW-VOLTAGE DISTRIBUTION NETWORK BASED ON VOLTAGE ASSOCIATION CHARACTERISTICS

CROSS-REFERENCE TO RELATED APPLICATION

This application is a 371 of international application of PCT application serial no. PCT/CN2020/142540, filed on Dec. 31, 2020, which claims the priority benefit of China application no. 202010550359.1, filed on Jun. 16, 2020. The entirety of each of the above mentioned patent applications is hereby incorporated by reference herein and made a part of this specification.

TECHNICAL FIELD

The present invention relates to the technical field of low-voltage distribution networks, and in particular, to a method for identifying consumer phase connectivity in low-voltage distribution network based on voltage correlation characteristics.

DESCRIPTION OF RELATED ART

The intelligent development of the current low-voltage distribution network is limited by the lack or inaccuracy of the physical topology connection information of the low-voltage distribution network. The lack of accurate low-voltage topology relation will lead to difficulties in three-phase unbalance treatment, abnormal line loss statistics, and untimely repairs for power outages. The topology identification of low-voltage distribution network is an important problem to be solved urgently by current power grid companies. The connection relation of user phase sequence, as an important part of low-voltage topology identification, has received wide attention.

Conventional methods include manual detection, installation of a signal receiving device, etc. Manual detection methods are time-consuming, inefficient, and prone to errors. The signal receiving device has a high accuracy, but the capital investment and subsequent operation and maintenance pressure of the device are high. The data analysis method has the advantages of small transformation amount and large input-output ratio, etc., and has become an important technical direction to solve the problems of household transformer relationship verification and user phase sequence identification in topology identification of a low-voltage distribution network.

SUMMARY

The objective of the present invention is to solve the problem of identifying consumer phase connectivity in low-voltage distribution network when user data is incomplete, which helps to improve the operation efficiency and customer satisfaction index of power grid enterprises.

Limited by power flow constraints, users with a close electrical distance have voltage association characteristics, and there are also association characteristics between users and a low-voltage bus in a phase sequence where the users are located. Based on this, in the present invention, firstly, classifying users by means of the voltage association characteristics among the users. Further, determining an initial consumer phase connectivity by means of voltage association characteristics between the users and the three-phase buses on the low-voltage side of the low-voltage distribution network. Finally, verifying the initial consumer phase connectivity according to the voltage association characteristics among the users, so as to obtain a final consumer phase connectivity identification result. Compared with other identification methods, the present invention only uses voltage data, and can solve the problem of identifying consumer phase connectivity in low-voltage distribution network when user data is incomplete, without adding an additional terminal device. Therefore, the present invention has the characteristics of being convenient to operate, reducing the human cost of an electric power company and increasing efficiency.

The objective of the present invention is achieved by at least one of the following technical solutions.

A method for identifying consumer phase connectivity in low-voltage distribution network based on voltage association characteristics, comprising the following steps:

(1) acquiring users to be identified and voltage time series data of three-phase buses on the low-voltage side of the low-voltage distribution network where the users to be identified are located;

(2) calculating voltage time series curve correlation coefficients among the users, and classifying a user having the maximum voltage time series curve correlation value with respect to the user into one category so as to form a user category set;

(3) based on the user classifications, determining an initial consumer phase connectivity according to the voltage association characteristics between the users and the three-phase buses on the low-voltage side of the low-voltage distribution network; and (4) verifying the initial consumer phase connectivity according to the voltage association characteristics among the users, so as to obtain a final consumer phase connectivity identification result.

Further, in the step (2), calculating voltage time series curve correlation coefficients among the users, and classifying the user having the maximum voltage time series curve correlation value with respect to the user into one category so as to form the user category set, specifically comprises:

step (2-1): calculating a voltage curve correlation coefficient matrix R included in a meter reading directory of the low-voltage distribution network, wherein elements in the u-th row of the matrix are voltage time series curve correlation coefficients between the user u and all users;

$$
R = \begin{bmatrix} r_{11} & \cdots & \cdots & \cdots & \cdots & r_{1M} \\ \vdots & \ddots & & & & \vdots \\ \vdots & & r_{uu} & r_{uv} & & \vdots \\ \vdots & & r_{vu} & r_{vv} & & \vdots \\ \vdots & & & & \ddots & \vdots \\ r_{M1} & \cdots & \cdots & \cdots & \cdots & r_{MM} \end{bmatrix}, \forall u, v \in \Theta
$$

wherein M represents a total number of users included in the meter reading directory of the low-voltage distribution network; $\Theta$ is users included in the meter reading directory of the low-voltage distribution network; $r_{uv}$ represents a voltage time series correlation coefficient between the user u and a user v, specifically as follows:

3

$$r_{uv} = r_{vu} = \frac{\sum_{t=1}^{T} U_v^t U_u^t - \frac{1}{T}\left(\sum_{t=1}^{T} U_u^t \sum_{t=1}^{T} U_v^t\right)}{\sqrt{\left(\sum_{t=1}^{T} U_v^{t2} - \frac{1}{T}\left(\sum_{t=1}^{T} U_v^t\right)^2\right)\left(\sum_{t=1}^{T} U_u^{t2} - \frac{1}{T}\left(\sum_{t=1}^{T} U_u^t\right)^2\right)}}$$

in the formula, $$U_u^t$$

and $$U_v^t$$

are respectively voltage values of the users u and v at time t, u, v∈Θ, t=1, 2, . . . , T step (2-2): based on the matrix R, classifying each user having the maximum time series curve correlation with respect to other user except the user itself into one category, so as to obtain Q double-table classifications in total;

step (2-3): performing union processing on classifications containing same user, and finally obtaining a user category set $\Omega_{cla}$ containing N categories in total, and ending the user classification.

Further, based on the user category set $\Omega_{cla}$, determining an initial consumer phase connectivity according to voltage association characteristics between the users and the three-phase buses on the low-voltage side of the low-voltage distribution network, specifically refers to:

step (3-1): calculating an average value of a voltage of each user, as shown below, $$U_{ave}^u = \left(\sum_{t=1}^{T} U_u^t\right)/T$$

in the formula, $U_{u_{ave}}$ is an average value of a voltage of a user u over a measurement period T;

$$U_u^t$$

is a value of the voltage of the user u at time t, =1, 2, . . . , T;

for the user category set $\Omega_{cla}$, extracting a user having the maximum voltage average value in each classification to constitute a user set ξ, and at this time, an element in ξ being the user closest to a head end in each classification;

step (3-2): calculating a voltage time series curve correlation coefficient between each user and the three-phase buses on the low-voltage side of the low-voltage distribution network in ξ, so as to obtain a matrix $R_1$, $$R_1 = \begin{bmatrix} r_{A,\xi(1)} & \cdots & r_{A,\xi(h)} & \cdots & r_{A,\xi(N)} \\ r_{B,\xi(1)} & \cdots & r_{B,\xi(h)} & \cdots & r_{B,\xi(N)} \\ r_{C,\xi(1)} & \cdots & r_{C,\xi(h)} & \cdots & r_{C,\xi(N)} \end{bmatrix}$$

4 in the formula, $r_{A,\xi(h)}$, $r_{B,\xi(h)}$, and $r_{C,\xi(h)}$ are respectively voltage time series curve correlation coefficients between the h-th user in the set ξ and bus of phase A on the low-voltage side of the low-voltage distribution network, between the h-th user in the set ξ and bus of phase B on the low-voltage side of the low-voltage distribution network and between the h-th user in the set ξ and bus of phase C on the low-voltage side of the low-voltage distribution network in the set ξ;

step (3-3): for the h-th user in the set ξ, the phase sequence of the bus on the low-voltage side of the low-voltage distribution network corresponding to max$\{r_{A,\xi(h)}$, $r_{B,\xi(h)}$, $r_{C,\xi(h)}\}$ serves as a phase sequence of the h-th user in the set ξ, and a phase sequence of each user in ξ is the phase sequence of all the users in the classification where the users is located, so as to obtain an initial consumer phase connectivity result $\Theta_0$.

Further, a calculation method of the matrix elements $r_{A,\xi(h)}$, $r_{B,\xi(h)}$, $r_{C,\xi(h)}$ is as follows:

$$r_{\varphi,\xi(h)} == \frac{\sum_{t=1}^{T} U_{\xi(h)}^t U_\varphi^t - \frac{1}{T}\left(\sum_{t=1}^{T} U_{\xi(h)}^t \sum_{t=1}^{T} U_\varphi^t\right)}{\sqrt{\left(\sum_{t=1}^{T} U_{\xi(h)}^{t2} - \frac{1}{T}\left(\sum_{t=1}^{T} U_{\xi(h)}^t\right)^2\right)\left(\sum_{t=1}^{T} U_\varphi^{t2} - \frac{1}{T}\left(\sum_{t=1}^{T} U_\varphi^t\right)^2\right)}},$$

$$\varphi \in \{A, B, C\}$$

in the formula, $$U_{\xi(h)}^t$$

is the voltage value of the h-th user in the set ξ at the time t, and $$U_\varphi^t$$

is a voltage value of bus of phase φ on the low-voltage side of the low-voltage distribution network at the time t.

Further, in the step (4), verifying the initial consumer phase connectivity according to the voltage association characteristics among the users so as to obtain a final consumer phase connectivity identification result, specifically comprising:

step (4-1): ranking users according to the average voltages from high to low, setting a first threshold coefficient τ, and extracting previous [τ*M] users in the user ranking result to form a set d as the user set closest to the head end on the low-voltage side of the low-voltage distribution network, wherein M is a total number of users included in a meter reading directory of the low-voltage distribution network;

step (4-2): for the user category set $\Omega_{cla}$ formed in step (2), extracting a user having the minimum voltage average value in each classification to constitute a user set χ, and at this time, an element in χ being the user closest to the bottom end in each classification;

step (4-3): making $\chi_1=\{u|u\in \chi$, and u∉d$\}$, and extracting correlation coefficients between each user and other users in $\chi_1$ from a matrix R of voltage curve correlation coefficients among the users, so as to obtain O=|$\chi_1$| vectors, and further for elements in each vector, ranking users according to the values from high to low;

step (4-4): setting a second threshold coefficient $\tau_1$; if in an initial consumer phase connectivity result, previous $\tau_1$ users having the maximum correlation coefficient of a voltage curve with respect to a certain user in $\chi_1$ is not in a same phase with the certain user, listing the user as an initial suspicious user, and adding the initial suspicious user into an initial suspicious user set $\chi_2$;

step (4-5): in an initial suspicious user set $\chi_2$, if a user having the maximum correlation of a voltage curve with respect to a certain user is not in the same phase with the certain user, determining the user to be an out-of-phase user; if a user having the maximum correlation with respect to the certain user also belongs to $\chi_2$, listing the user in a suspicious user set $\chi_3$;

step (4-6): in the suspicious user set $\chi_3$, if a user having the maximum correlation of a voltage curve of with respect to the certain user also belongs to $\chi_3$, determining the user to be an out-of-phase user; and step (4-7): for the out-of-phase users in step (4-5) and step (4-6), updating the phase sequences of the out-of-phase users to be the phase sequences of the previous $\tau_1$ users whose phase sequences are different from the phase sequences of the out-of-phase users so as to obtain a final consumer phase identification result, and ending the identification.

Further, the first threshold coefficient $\tau \in [0,0.5]$.

Further, the second threshold coefficient $\tau_1$ is given according to expert experience.

The present invention has the following beneficial effects:

(1) only using voltage data, the present invention is suitable for identifying consumer phase connectivity in low-voltage distribution network when user data is incomplete, and is beneficial to improve the accuracy of identifying consumer phase connectivity in low-voltage distribution network in practical applications;

(2) there is no need to add an acquisition terminal in a low-voltage distribution network, and therefore the present invention has the advantages of low cost and low engineering amount.

BRIEF DESCRIPTION OF THE DRAWINGS

FIG. 1 is a flowchart of the method for identifying consumer phase connectivity in low-voltage distribution network based on voltage association characteristics.

DESCRIPTION OF THE EMBODIMENTS

Figure 2:
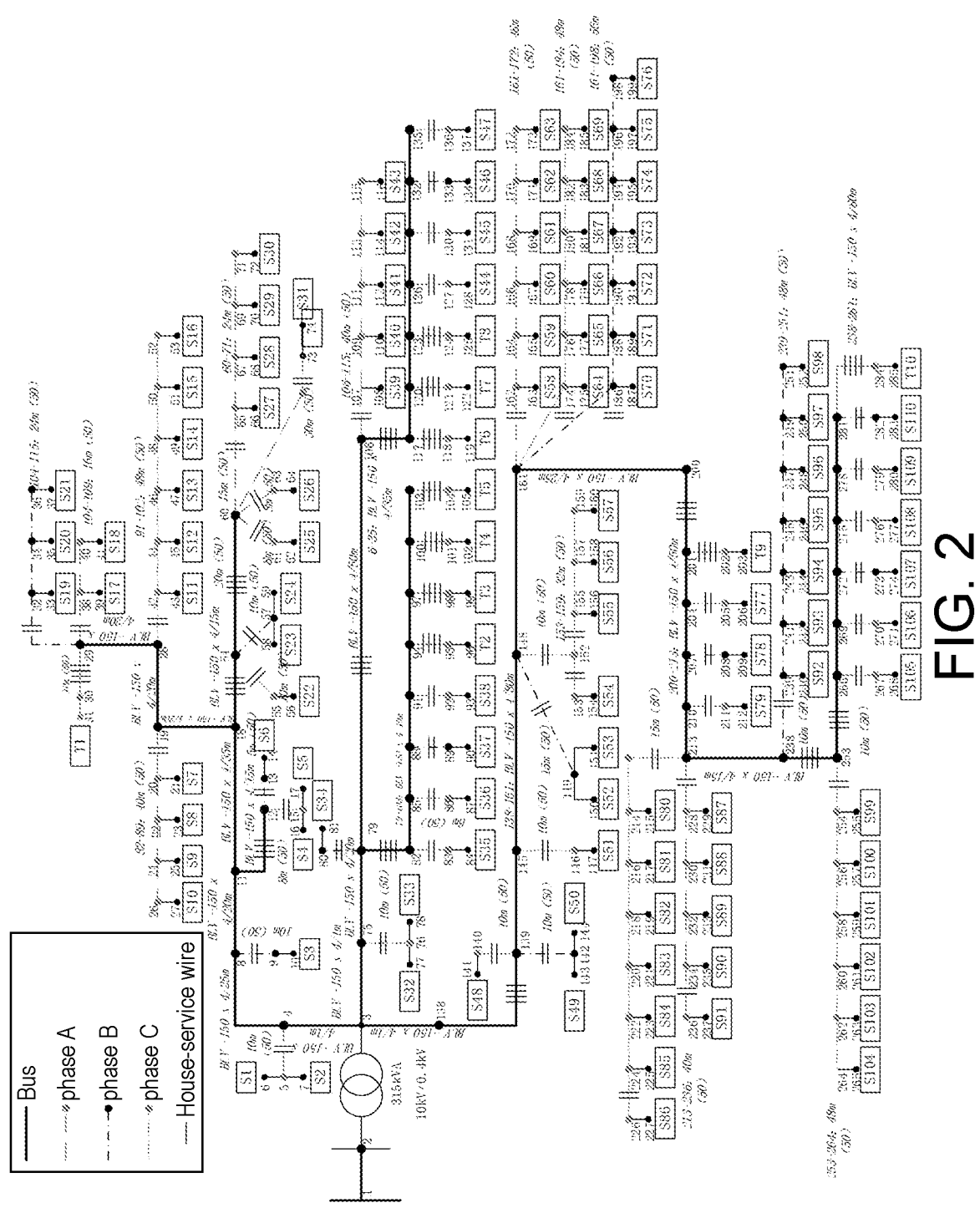
FIG. 2 is a schematic diagram of a wiring network of an actual low-voltage distribution network.

Specific implementations of the present invention are further described below with reference to the accompanying drawings and embodiments.

FIG. 1 is a method for identifying consumer phase connectivity in low-voltage distribution network based on voltage association characteristics provided by an embodiment of the present invention. The method comprises the following steps:

(1) acquiring users to be identified and voltage time series data of three-phase buses on the low-voltage side of the low-voltage distribution network where the users to be identified are located;

Exemplarily, in view of FIG. 2, a low-voltage distribution network is illustrated, and the low-voltage distribution network includes 37 A phase electricity meters, 42 B phase electricity meters, 31 C phase electricity meters and 10 three-phase electricity users. In FIG. 2, S represents a single-phase user, the number following S represents the serial number of an electricity meter, T represents a three-phase user, each three-phase electricity meter can be seen as three independent single-phase electricity meters, the serial number following T represents the serial number of the three-phase electricity meter and the phase to which the meter belongs, the last 1, 2 and 3 respectively represent phases A, B and C, for example, T11, T12 and T13 respectively represent phases A, B and C of the three-phase electricity meter of serial number 1. Acquiring voltage time series data of a bus on a low-voltage side of the distribution transformer in the low-voltage distribution network and all electricity meters for 2 days, in which seven electricity meters affected by communication failed to acquire information. These seven meters are S21, S47, S91, S92, S104, S109, and the C-phase data of the three-phase electricity meter T9, i.e., T93; therefore, these seven meters are removed, and these seven meters will not be identified in a subsequent identification process.

(2) calculating voltage time series curve correlation coefficients among the users, and classifying a user having the maximum voltage time series curve correlation value with respect to the user into one category so as to form a user category set $\Omega_{cla}$, specifically comprises:

step (2-1): calculating a voltage curve correlation coefficient matrix R included in a meter reading directory of the low-voltage distribution network, wherein elements in the u-th row of the matrix are voltage time series curve correlation coefficients between a user u and all users;

$$R = \begin{bmatrix} r_{11} & \cdots & \cdots & \cdots & \cdots & r_{1M} \\ \vdots & \ddots & & & & \vdots \\ \vdots & & r_{uu} & r_{uv} & & \vdots \\ \vdots & & r_{vu} & r_{vv} & & \vdots \\ \vdots & & & & \ddots & \vdots \\ r_{M1} & \cdots & \cdots & \cdots & \cdots & r_{MM} \end{bmatrix}, \forall\, u, v \in \Theta$$

wherein $r_{11}$, $r_{uu}$, $r_{vv}$ and $r_{MM}$ respectively represent a voltage time series curve correlation coefficient between a user 1 and the user 1 itself, a voltage time series curve correlation coefficient between a user u and the user u itself, a voltage time series curve correlation coefficient between a user v and the user v itself, and a voltage time series curve correlation coefficient between a user M and the user M itself, and are all 1; $r_{1M}$ represents the voltage time series correlation coefficient between the user 1 and the user M; $r_{M1}$ represents the voltage time series correlation coefficient between the user M and the user 1; M represents the total number of users included in a meter reading directory of the low-voltage distribution network; $\Theta$ is the users included in the meter reading directory of the low-voltage distribution network; $r_{uv}=r_{vu}$, $r_{uv}$ represents the voltage time series correlation coefficient between the user u and the user v, specifically as follows:

$$r_{uv} = r_{vu} = \frac{\sum\limits_{t=1}^{T} U_v^t U_u^t - \frac{1}{T}\left(\sum\limits_{t=1}^{T} U_u^t \sum\limits_{t=1}^{T} U_v^t\right)}{\sqrt{\left(\sum\limits_{t=1}^{T} U_v^{t2} - \frac{1}{T}\left(\sum\limits_{t=1}^{T} U_v^t\right)^2\right)\left(\sum\limits_{t=1}^{T} U_u^{t2} - \frac{1}{T}\left(\sum\limits_{t=1}^{T} U_u^t\right)^2\right)}}$$

in the formula, $$U_u^t$$

and $$U_v^t$$

are respectively voltage values of the user u and v at the time t, u, v∈Θ, t=1, 2, . . . , T.

step (2-2): based on the matrix R, classifying each user having the maximum time series curve correlation with respect to other user except the user itself into one category, so as to obtain Q double-table classifications in total; and step (2-3): performing union processing on the classifications containing the same users, and finally obtaining a user category set $\Omega_{cla}$ containing N categories in total, and ending the user classification.

The user category set obtained thereby is as follows:

TABLE 1

| User category set | | |
|---|---|---|
| user category | user category | user category |
| S1, S2 | T12, S11, S12 | S3, S19, S20 |
| S7, S8, S9, S10 | S13, S14, S15, S16 | S6, T13, S23, S24 |
| T11, S17, S18 | S32, S33, T62, T72, T82, S45 | S34, T33, T43, T53 |
| S25, S26, S27, S31 | S36, T22, T32, T42, T52 | S37, T23 |
| S28, S29, S30 | S51, S54, S55, S56, S57 | T63, T73, T83, S46 |
| S35, S39, S40, S41, S42, S43 | S64, S65, T92, S77 | S49, S50 |
| S38, T21, T31, T41, T51 | S66, S67, S68, S69 | S52, S53, S70, S71, S78 |
| T61, T71, T81, S44 | S80, S106, T102 | S72, S73, S74, S75, S76 |
| S58, S59, S60, S61 | S81, S82, S83, S84, S85, S86 | S93, S94, S95, S96 |
| S62, S63 | S99, S100, S101 | S97, S98 |
| T91, S79, S87, S88, S89, S90, S105, S108, T101 | S102, S103 | S107, S110, T103 |
| S4, S5, S22, S48 | | |

(3) based on the user classifications, determining an initial consumer phase connectivity according to voltage association characteristics between the users and the three-phase buses on the low-voltage side of the low-voltage distribution network, specifically referring to:

step (3-1): calculating an average value of the voltage of each user, as shown below, $$U_{ave}^u = \left(\sum_{t=1}^{T} U_u^t\right)/T$$

in the formula, $U_{u_{ave}}$ is an average value of the voltage of the user u over the measurement period T;

$$U_u^t$$

is the value of the voltage of the user t at the time t=1, 2, . . . , T.

for the user category set $\Omega_{cla}$ formed in step 2, extracting a user having the minimum voltage average value in each classification to constitute a user set ξ, and at this time, an element in ξ being the user closest to the bottom end in each classification;

step (3-2): calculating a voltage time series curve correlation coefficient between each user in ξ and the three-phase buses on the low-voltage side of the low-voltage distribution network, so as to obtain a matrix $R_1$, $$R_1 = \begin{bmatrix} r_{A,\xi(1)} & \cdots & r_{A,\xi(h)} & \cdots & r_{A,\xi(N)} \\ r_{B,\xi(1)} & \cdots & r_{B,\xi(h)} & \cdots & r_{B,\xi(N)} \\ r_{C,\xi(1)} & \cdots & r_{C,\xi(h)} & \cdots & r_{C,\xi(N)} \end{bmatrix}$$

$r_{A,\xi(N)}$, $r_{B, \xi(N)}$, and $r_{C, \xi(N)}$ are respectively voltage time series curve correlation coefficients between the N-th user in the set ξ and bus of phase A of three-phase on the low-voltage side of the low-voltage distribution network, between the h-th user in the set ξ and bus of phase B of three-phase on the low-voltage side of the low-voltage distribution network, and between the h-th user in the set ξ and bus of phase C of three-phase on the low-voltage side of the low-voltage distribution network, wherein h<N, a calculation method of the matrix elements $r_{A, \xi(h)}$, $r_{B, \xi(h)}$, $r_C$ and ξ(h) is as follows:

$$r_{\varphi,\xi(h)} = \frac{\sum_{t=1}^{T} U_{\xi(h)}^t U_\varphi^t - \frac{1}{T}\left(\sum_{t=1}^{T} U_{\xi(h)}^t \sum_{t=1}^{T} U_\varphi^t\right)}{\sqrt{\left(\sum_{t=1}^{T} U_{\xi(h)}^{t2} - \frac{1}{T}\left(\sum_{t=1}^{T} U_{\xi(h)}^t\right)^2\right)\left(\sum_{t=1}^{T} U_\varphi^{t2} - \frac{1}{T}\left(\sum_{t=1}^{T} U_\varphi^t\right)^2\right)}},$$

$$\varphi \in \{A, B, C\}$$

in the formula, $$U_{\xi(h)}^t$$

is the voltage value of the h-th user in the set $\xi$ at the time t, and $$U_\varphi^t \qquad\qquad 5$$

is the voltage value of bus of phase $\varphi$ on the low-voltage side of the low-voltage distribution network at the time t.

step (3-3): for the h-th user in the set $\xi$, the phase sequence of the bus on the low-voltage side of the low-voltage distribution network corresponding to $\max\{r_{A,\xi(h)}, r_{B,\xi(h)}, r_{C,\xi(h)}\}$ serves as the phase sequence of the h-th user in the set $\xi$, and the phase sequence of each user in $\xi$ is the phase sequence of all the users in the classification where the users are located, so as to obtain an initial phase relationship result $\Theta_0$, as shown in table 2.

TABLE 2

| Initial user-phase sequence result | |
| --- | --- |
| Phase sequence | User |
| Phase A | S1, S2, S7, S8, S9, S10, T11, S17, S18, S25, S26, S27, S31, S28, S29, S30, S35, S39, S40, S41, S42, S43, S38, T21, T31, T41, T51, T61, T71, T81, S44, S58, S59, S60, S61, S62, S63, T91, S79, S87, S88, S89, S90, S105, S108, T101, S80, S106, T102, S81, S82, S83, S84, S85, S86 |
| Phase B | S4, S5, S22, S48, T12, S11, S12, S13, S14, S15, S16, S32, S33, T62, T72, T82, S45, S36, T22, T32, T42, T52, S51, S54, S55, S56, S57, S64, S65, T92, S77, S66, S67, S68, S69, S99, S100, S101, S102, S103 |
| Phase C | S3, S19, S20, S6, T13, S23, S24, S34, T33, T43, T53, S37, T23, T63, T73, T83, S46, S49, S50, S52, S53, S70, S71, S78, S72, S73, S74, S75, S76, S93, S94, S95, S96, S97, S98, S107, S110, T103 |

(4) verifying the initial consumer phase connectivity according to the voltage association characteristics among the users, so as to obtain a final consumer phase connectivity identification result, specifically comprises:

step (4-1): ranking all users according to the average voltages from high to low, setting a first threshold coefficient $\tau \in [0,0.5]$, and extracting previous $[\tau*M]$ users in the user ranking result to form a set d as the user set closest to the head end on the low-voltage side of the low-voltage distribution network, wherein M is the total number of users included in a meter reading directory of the low-voltage distribution network;

step (4-2): for the user category set $\Omega_{cla}$ formed in step (2), extracting a user having the minimum voltage average value in each classification to constitute a user set $\chi$, and at this time, an element in $\chi$ being the user closest to the bottom end in each classification;

step (4-3): making $\chi_1 = \{u | u \in \chi, \text{ and } u \notin d\}$, and extracting correlation coefficients between each user and other users in $\chi_1$ from a matrix R of voltage curve correlation coefficients among the users, so as to obtain $O = |\chi_1|$ vectors, and further for elements in each vector, ranking users in each vector according to the values from high to low;

step (4-4): setting a second threshold coefficient $\tau_1$, wherein the value of the second threshold coefficient is given by expert experience; in the present embodiment, $\tau_1 = 3$; if in an initial consumer phase connectivity result, previous $\tau_1$ users having the maximum correlation coefficient of a voltage curve with respect to a certain user in $\chi_1$ is not in the same phase with the certain user, listing the user (i.e., the aforesaid certain user) as an initial suspicious user, and adding the initial suspicious user into an initial suspicious user set $\chi_2$;

step (4-5): in an initial suspicious user set $\chi_2$, if a user having the maximum correlation of a voltage curve with respect to a certain user is not in the same phase with the certain user, determining the user (i.e., the aforesaid certain user) to be an out-of-phase user; if a user having the maximum of the certain user also belongs to $\chi_2$, listing the user (i.e., the aforesaid certain user) in a suspicious user set $\chi_3$;

step (4-6): in the suspicious user set $\chi_3$, if a user having the maximum correlation of a voltage curve with respect to a certain user also belongs to $\chi_3$, determining the user (i.e., the aforesaid certain user) to be an out-of-phase user; and step (4-7): for the out-of-phase users in step (4-5) and step (4-6), updating the phase sequences of the out-of-phase users to be the phase sequences of the first user in the previous $\tau_1$ users whose phase sequences are different from the phase sequences of the out-of-phase users so as to obtain a final consumer phase identification result.

The meters identified incorrectly in the initial consumer phase connectivity result are S80, S106, T102, S81, S82, S83, S84, S85, S86. The phase sequence of these users is changed from phase A to phase C, and finally the consumer phase identification relationship of the low-voltage distribution network is as shown in the following table:

TABLE 3

| Final user-phase sequence result | |
| --- | --- |
| Phase sequence | User |
| Phase A | S1, S2, S7, S8, S9, S10, T11, S17, S18, S25, S26, S27, S31, S28, S29, S30, S35, S39, S40, S41, S42, S43, S38, T21, T31, T41, T51, T61, T71, T81, S44, S58, S59, S60, S61, S62, S63, T91, S79, S87, S88, S89, S90, S105, S108, T101 |
| Phase B | S4, S5, S22, S48, T12, S11, S12, S13, S14, S15, S16, S32, S33, T62, T72, T82, S45, S36, T22, T32, T42, T52, S51, S54, S55, S56, S57, S64, S65, T92, S77, S66, S67, S68, S69, S99, S100, S101, S102, S103 |

TABLE 3-continued

Final user-phase sequence result

| Phase sequence | User |
|---|---|
| Phase C | S3, S19, S20, S6, T13, S23, S24, S34, T33, T43, T53, S37, T23, T63, T73, T83, S46, S49, S50, S52, S53, S70, S71, S78, S72, S73, S74, S75, S76, S93, S94, S95, S96, S97, S98, S107, S110, T103, S80, S106, T102, S81, S82, S83, S84, S85, S86 |

It can be determined in conjunction with FIG. 2 that the results shown in table 3 correctly reflect the consumer phase connectivity of the low-voltage distribution network.

In conclusion, the foregoing examples illustrate the effectiveness of a method for identifying consumer phase connectivity in low-voltage distribution network based on voltage association characteristics provided by the embodiments of the present invention.

The above embodiments are preferred embodiments of the present invention, but the embodiments of the present invention are not limited to the above embodiments, and any other modification, decoration, substitution, combination and simplification made without departing from the spirit and principle of the present invention shall all be equivalent substitution, and shall belong to the scope of protection of the present invention.

What is claimed is:

1. A method for identifying consumer phase connectivity in low-voltage distribution network based on voltage association characteristics, comprising following steps:

step (1): acquiring users to be identified and voltage time series data of three-phase buses on a low-voltage side of the low-voltage distribution network where the users to be identified are located;

step (2): calculating voltage time series curve correlation coefficients among the users to be identified, and classifying a user having a maximum time series curve correlation value with respect to the user into one category, to form a user category set $\Omega_{cla}$;

step (3): based on the user category set $\Omega_{cla}$, determining an initial consumer phase connectivity according to the voltage association characteristics between the users to be identified and the three-phase buses on the low-voltage side of the low-voltage distribution network; and step (4): verifying the initial consumer phase connectivity according to the voltage association characteristics among the users to be identified, to obtain a final consumer phase connectivity identification result utilized in the low-voltage side of the low-voltage distribution network comprising electricity meters of the users to be identified, wherein in the step (2), calculating the voltage time series correlation coefficients among the users to be identified, and classifying the user having the maximum voltage time series correlation value with respect to the user into one category to form the user category set $\Omega_{cla}$, comprises:

step (2-1): calculating a matrix R of voltage curve correlation coefficients among the users to be identified comprised in a meter reading directory of the low-voltage distribution network, wherein elements in a u-th row of the matrix R is voltage time series curve correlation coefficients between a user u and all users;

$$R = \begin{bmatrix} r_{11} & \cdots & \cdots & \cdots & \cdots & r_{1M} \\ \vdots & \ddots & & & & \vdots \\ \vdots & & r_{uu} & r_{uv} & & \vdots \\ \vdots & & r_{vu} & r_{vv} & & \vdots \\ \vdots & & & & \ddots & \vdots \\ r_{M1} & \cdots & \cdots & \cdots & \cdots & r_{MM} \end{bmatrix}, \forall u, v \in \Theta$$

wherein $r_{11}$, $r_{uu}$, $r_{vv}$ and $r_{MM}$ respectively represent a voltage time series curve correlation coefficient between a user 1 and the user 1 itself, a voltage time series curve correlation coefficient between a user u and the user u itself, a voltage time series curve correlation coefficient between a user v and the user y itself and a voltage time series curve correlation coefficient between a user M and the user M itself, and are all 1; $r_{1M}$ represents a voltage time series correlation coefficient between the user 1 and the user M; $r_{M1}$ represents a voltage time series correlation coefficient between the user M and the user 1; M represents a total number of users comprised in the meter reading directory of the low-voltage distribution network; $\Theta$ is the users comprised in the meter reading directory of the low-voltage distribution network; $r_{uv}=r_{vu}$ represents a voltage time series correlation coefficient between the user u and the user v, as formula below:

$$r_{uv} = r_{vu} = \frac{\sum_{t=1}^{T} U_v^t U_u^t - \frac{1}{T}\left(\sum_{t=1}^{T} U_u^t \sum_{t=1}^{T} U_v^t\right)}{\sqrt{\left(\sum_{t=1}^{T} U_v^{t2} - \frac{1}{T}\left(\sum_{t=1}^{T} U_v^t\right)^2\right)\left(\sum_{t=1}^{T} U_u^{t2} - \frac{1}{T}\left(\sum_{t=1}^{T} U_u^t\right)^2\right)}}$$

wherein in the formula, $$U_u^t$$

and $$U_v^t$$

respectively are voltage values of the user u and the user v at time t, u and v$\in \Theta$, t=1, 2, . . . , T, wherein in the step (3), based on the user category set $\Omega_{cla}$, determining the initial consumer phase connectivity according to voltage association characteristics between the users to be identified and the three-phase buses on the low-voltage side of the low-voltage distribution network, comprises:

step (3-1): calculating an average value of a voltage of each user, as formula below, $$U_{ave}^u = \left( \sum_{t=1}^{T} U_u^t \right) / T$$

wherein in the formula, $$U_{\underline{u}_{ave}}^-$$

is an average value of a voltage of the user u over a measurement period T;

$$U_u^t$$

is a value of a voltage of a user u at time t, t=1, 2 . . . , T, and for the user category set $\Omega_{cla}$, extracting a user having the maximum voltage average value in each classification to constitute a user set $\xi$, and at this time, an element in $\xi$ being the user closest to a head end in each classification;

step (3-2): calculating a voltage time series curve correlation coefficient between each user in $\xi$ and the three-phase buses on the low-voltage side of the low-voltage distribution network, to obtain a matrix $R_1$, $$R_1 = \begin{bmatrix} r_{A,\xi(1)} & \cdots & r_{A,\xi(h)} & \cdots & r_{A,\xi(N)} \\ r_{B,\xi(1)} & \cdots & r_{B,\xi(h)} & \cdots & r_{B,\xi(N)} \\ r_{C,\xi(1)} & \cdots & r_{C,\xi(h)} & \cdots & r_{C,\xi(N)} \end{bmatrix}$$

wherein in the matrix $R_1$, $r_{A,\xi(h)}$, $r_{B,\xi(h)}$ and $r_{C,\xi(h)}$ are respectively voltage time series curve correlation coefficients between an h-th user in the set $\xi$ and bus of phase A on the low-voltage side of the low-voltage distribution network, between the h-th user in the set $\xi$ and bus of phase B on the low-voltage side of the low-voltage distribution network, and between the h-th user in the set $\xi$ and bus of phase C on the low-voltage side of the low-voltage distribution network, and $r_{A,\xi(N)}$, $r_{B,\xi(N)}$ and $r_{C,\xi(N)}$ are respectively voltage time series curve correlation coefficients between an N-th user in the set $\xi$ and bus of phase A of three-phase on the low-voltage side of the low-voltage distribution network, between the N-th user in the set $\xi$ and bus of phase B of three-phase on the low-voltage side of the low-voltage distribution network, and between the N-th user in the set $\xi$ and bus of phase C of three-phase on the low-voltage side of the low-voltage distribution network, wherein h<N, wherein in the step (4), verifying the initial consumer phase connectivity according to the voltage association characteristics among the users to be identified, to obtain the final consumer phase connectivity identification result, comprises:

step (4-4): setting a second threshold coefficient $\tau_1$; if in an initial consumer phase connectivity result, previous $\tau_1$ users having a maximum correlation coefficient of a voltage curve with respect to a certain user in a set $\chi_1$ is not in a same phase with the certain user, listing the user as an initial suspicious user, and adding the initial suspicious user into an initial suspicious user set $\chi_2$;

step (4-5): in the initial suspicious user set $\chi_2$, if the user having the maximum correlation of the voltage curve with respect to the certain user is not in the same phase with the certain user, determining the user to be an out-of-phase user; if the user having the maximum correlation with respect to the certain user also belongs to the initial suspicious user set $\chi_2$, listing the user in a suspicious user set $\chi_3$;

step (4-6): in the suspicious user set $\chi_3$, if the user having the maximum correlation of the voltage curve with respect to the certain user also belongs to the suspicious user set $\chi_3$, determining the user to be the out-of-phase user; and step (4-7): for the out-of-phase users in the step (4-5) and the step (4-6), updating phase sequences of the out-of-phase users to be phase sequences of a first user in the previous $\tau_1$ users whose phase sequences are different from the phase sequences of the out-of-phase users to obtain the final consumer phase connectivity identification result, and ending the identification, and utilizing the final consumer phase connectivity identification result to change the users to be identified having incorrect phase electricity meters.

2. The method for identifying the consumer phase connectivity in the low-voltage distribution network based on the voltage association characteristics according to claim 1, wherein in the step (2), calculating the voltage time series correlation coefficients among the users to be identified, and classifying the user having the maximum voltage time series correlation value with respect to the user into one category to form the user category set $\Omega_{cla}$, further comprises:

step (2-2): based on the matrix R, classifying each user having the maximum time series curve correlation with respect to other user except the user itself into one category, to obtain Q double-table classifications in total; and step (2-3): performing union processing on classifications containing the same users, and finally obtaining the user category set $\Omega_{cla}$ containing N categories in total, and ending the user classification.

3. The method for identifying the consumer phase connectivity in the low-voltage distribution network based on the voltage association characteristics according to claim 2, wherein in the step (4), verifying the initial consumer phase connectivity according to the voltage association characteristics among the users to be identified, to obtain the final consumer phase connectivity identification result, further comprises:

step (4-1): ranking all users according to the average voltages from high to low, setting a first threshold coefficient t, and extracting previous [$\tau$*M] users in the user ranking result to form a set d as the user set closest to the head end on the low-voltage side of the low-voltage distribution network, wherein M is a total number of users comprised in a meter reading directory of the low-voltage distribution network;

step (4-2): for the user category set $\Omega_{cla}$, extracting a user having a minimum voltage average value in each classification to constitute a user set $\chi$, and at this time, an element in the user set $\chi$ being the user closest to a bottom end in each classification;

step (4-3): making a set $\times_1=\{u|u\in\chi, \text{ and } u\notin d\}$, and extracting correlation coefficients between each user and other users in the set $\times_1$ from the matrix R of voltage curve correlation coefficients among the users, so as to obtain $O=[\chi_1]$ vectors, and further for elements in each vector, ranking the users according to the values from high to low.

4. The method for identifying the consumer phase connectivity in the low-voltage distribution network based on the voltage association characteristics according to claim 1, wherein in the step (3), based on the user category set $\Omega_{cla}$, determining the initial consumer phase connectivity according to voltage association characteristics between the users to be identified and the three-phase buses on the low-voltage side of the low-voltage distribution network, further comprises:

step (3-3): for the h-th user in the set $\xi$, serving a phase sequence of the bus on the low-voltage side of the low-voltage distribution network corresponding to max $\{r_{A,\xi(h)}, r_{B,\xi(h)}, r_{C,\xi(h)}\}$ as a phase sequence of the h-th user in the set § , wherein a phase sequence of each user in the set $\xi$ is the phase sequence of all the users in the classification where the users is located, to obtain an initial consumer phase connectivity result $\Theta_0$.

5. The method for identifying the consumer phase connectivity in the low-voltage distribution network based on the voltage association characteristics according to claim 4, wherein a calculation method of the matrix elements $r_{A, \xi(h)}$, $r_{B, \xi(h)}$, $r_{C, \xi(h)}$ comprises formula below:

$$r_{\varphi,\xi(h)} == \frac{\sum_{t=1}^{T} U_{\xi(h)}^t U_{\varphi}^t - \frac{1}{T}\left(\sum_{t=1}^{T} U_{\xi(h)}^t \sum_{t=1}^{T} U_{\varphi}^t\right)}{\sqrt{\left(\sum_{t=1}^{T} U_{\xi(h)}^{t2} - \frac{1}{T}\left(\sum_{t=1}^{T} U_{\xi(h)}^t\right)^2\right)\left(\sum_{t=1}^{T} U_{\varphi}^{t2} - \frac{1}{T}\left(\sum_{t=1}^{T} U_{\varphi}^t\right)^2\right)}},$$

$$\varphi \in \{A, B, C\}$$

wherein in the formula, $$U_{\xi(h)}^t$$

is a voltage value of the h-th user in the set $\xi$ at the time t, and $$U_{\varphi}^t$$

is a voltage value of bus of phase $\varphi$ on a low-voltage side of the low-voltage distribution network at the time t.

6. The method for identifying the consumer phase connectivity in the low-voltage distribution network based on the voltage association characteristics according to claim 3, wherein the first threshold coefficient $\tau \in [0, 0.5]$.

7. The method for identifying consumer phase connectivity in low-voltage distribution network based on the voltage association characteristics according to claim 3, wherein the second threshold coefficient $\tau_1$ is given according to expert experience.

\* \* \* \* \*